United States Patent
Haiden et al.

(10) Patent No.: US 12,127,350 B2
(45) Date of Patent: Oct. 22, 2024

(54) BARRIER FOR PREVENTING SMD COMPONENTS FROM DRIFTING

(71) Applicant: ZKW Group GmbH, Wieselburg (AT)

(72) Inventors: Christoph Haiden, Ternitz (AT);
Johannes Spitzer, Mollersdörf (AT);
Christoph Rainer, Aspang (AT)

(73) Assignee: ZKW Group GmbH, Wieselburg (AT)

(*) Notice: Subject to any disclaimer, the term of this patent is extended or adjusted under 35 U.S.C. 154(b) by 170 days.

(21) Appl. No.: 17/917,981

(22) PCT Filed: Apr. 29, 2021

(86) PCT No.: PCT/EP2021/061288
§ 371 (c)(1),
(2) Date: Oct. 10, 2022

(87) PCT Pub. No.: WO2021/219800
PCT Pub. Date: Nov. 4, 2021

(65) Prior Publication Data
US 2023/0144136 A1     May 11, 2023

(30) Foreign Application Priority Data
Apr. 30, 2020   (EP) .................... 20172361

(51) Int. Cl.
*B23K 1/00* (2006.01)
*H05K 3/34* (2006.01)
*B23K 101/36* (2006.01)

(52) U.S. Cl.
CPC ........... *H05K 3/341* (2013.01); *B23K 1/0016* (2013.01); *B23K 2101/36* (2018.08); *H05K 2203/0126* (2013.01); *H05K 2203/168* (2013.01)

(58) Field of Classification Search
CPC ...... H05K 3/341; H05K 1/0206; H05K 1/111; H05K 3/305; H05K 2201/09063;
(Continued)

(56) References Cited

U.S. PATENT DOCUMENTS 4,139,881 A * 2/1979 Shimizu ............... H05K 3/3468
228/180.1
5,842,275 A   12/1998 McMillian et al.
(Continued)

FOREIGN PATENT DOCUMENTS

EP       0817550 A1    1/1998
JP       S5929068 U    2/1984

OTHER PUBLICATIONS

International Search Report for PCT/EP2021/061288 dated Jul. 9, 2021 (13 pages).
(Continued)

*Primary Examiner* — Erin B Saad
(74) *Attorney, Agent, or Firm* — Eversheds Sutherland (US) LLP (57) ABSTRACT

A method for soldering an SMD component to a circuit carrier in a positionally stable manner, includes: a) providing a circuit carrier including a printed circuit board (PCB) contact surface, which is coated with a soldering paste (SP); b) applying an adhesive point onto the circuit carrier wherein the adhesive point delimits the PCB contact surface coated with SP; c) placing an SMD component, which includes a component contact surface, on the PCB contact surface coated with SP wherein the component contact surface contacts the PCB contact surface via the SP and the SMD component rests on the SP without contacting the adhesive point; d) waiting to complete a curing process of the adhesive point; and e) heating, melting and subsequently cooling the SP to produce an electric, thermal and/or a mechanical connection between the component and PCB
(Continued)

contact surfaces, wherein the SMD component is allowed to vertically sink in molten SP and is mechanically restricted from drifting horizontally on the molten SP by means of a barrier.

17 Claims, 4 Drawing Sheets

(58) Field of Classification Search
CPC ... H05K 2201/0959; H05K 2201/1031; B23K 1/0016; B23K 2101/36
See application file for complete search history.

(56) References Cited

U.S. PATENT DOCUMENTS

| | | | | |
|---|---|---|---|---|
| 5,920,462 | A * | 7/1999 | Glovatsky | H05K 1/0206 361/767 |
| 6,175,500 | B1 * | 1/2001 | Roy | H05K 1/0209 165/80.3 |
| 6,296,174 | B1 * | 10/2001 | Chiang | B23K 1/0016 228/180.21 |
| 6,838,760 | B1 * | 1/2005 | Cobbley | H01L 23/3121 257/680 |
| 7,126,210 | B2 * | 10/2006 | Chiu | H01L 23/13 257/E23.101 |
| 7,256,070 | B2 * | 8/2007 | Reiss | H01L 23/49827 257/784 |
| 7,709,744 | B2 * | 5/2010 | Schaefer | H05K 3/341 174/250 |
| 8,633,597 | B2 * | 1/2014 | Sweeney | H01L 25/03 257/685 |
| 10,756,472 | B2 * | 8/2020 | Lim | H01R 13/2442 |
| 10,823,355 | B2 * | 11/2020 | Fu | H05K 3/3431 |
| 10,971,468 | B2 * | 4/2021 | Mahajan | B81C 3/005 |
| 2015/0116970 | A1 | 4/2015 | Kishi et al. | |
| 2016/0205785 | A1 | 7/2016 | Kieslinger et al. | |
| 2019/0320561 | A1 * | 10/2019 | Lim | H01R 4/027 |
| 2020/0098660 | A1 | 3/2020 | Wakaiki et al. | |
| 2023/0144136 | A1 * | 5/2023 | Haiden | H05K 3/305 228/180.22 |

OTHER PUBLICATIONS

Search Report for European Patent Application No. 20172361.6 dated Oct. 26, 2020 (9 pages).

Office Action for Japanese Application No. 2022-565550 dated Aug. 22, 2023 (12 Pages).

* cited by examiner

BARRIER FOR PREVENTING SMD COMPONENTS FROM DRIFTING

The invention relates to a method for soldering an SMD component to a circuit carrier in a positionally stable manner.

The invention additionally relates to a circuit carrier manufactured in accordance with the inventive method. Furthermore, the invention may also relate to a motor vehicle headlamp and/or a control device comprising an inventive circuit carrier.

Methods that should allow the positionally stable soldering of SMD components are already known from the prior art. For example, AT 515071 A1 discloses a method, in which an electronic component to be soldered is fixed on a circuit carrier by means of adhesive points, wherein the adhesive points are cured before a soldering process is started in order to thereby prevent the components from drifting off.

It is basically known that the volume of soldering material is reduced during the soldering process due to flux outgassing. For example, this reduction may be as high as 50%. If an electronic component is adhesively fixed in its position, sufficient excess soldering material therefore needs to be provided in order to ensure that a sufficient quantity of soldering material is present at the soldering point despite its shrinkage. If the component to be soldered is already fixed in its position prior to the soldering process as proposed in AT 515071 A1, the decrease in volume of the soldering material is compensated by means of "overprinting." This refers to the arrangement of excess soldering material in regions extending beyond the actual contact point in order to allow this excess soldering material to flow toward the actual contact point during the melting process. Otherwise, a soldered connection may be defective because larger air inclusions are present or continuous full-surface contacting may be impossible due to a lack of soldering material.

However, there are situations in which such overprinting is not possible, for example, because adjacent components do not allow this overprinting or because the soldering material deposits on a circuit board layout are already specified and an existing circuit board layout should now merely be populated with a differently dimensioned electronic component without making changes to the circuit carrier or the soldering material deposits. At the same time, the most economical manufacturability possible should be preserved.

An objective of the invention therefore can be seen in developing a method that provides a solution to the above-defined problem. This objective is attained with a method of the initially cited type, in which the following inventive steps are carried out:

a) providing a circuit carrier comprising at least one printed circuit board contact surface that is coated with soldering paste and designed for electrically, thermally and/or mechanically contacting the SMD component to be connected, wherein a number of filled vias, which cannot be coated with molten soldering material, extend through the circuit carrier at least in the region of the printed circuit board contact surface (with said vias being realized, e.g., in the form of electric insulating material such as resin, i.e. epoxy, but alternatively also in the form of electrically conductive materials or combinations thereof such as epoxy that is filled with metal particles and has an increased thermal conductivity, as well as epoxy that is filled with ceramic material), b) applying at least one adhesive point onto the circuit carrier in such a way that this adhesive point delimits the printed circuit board contact surface coated with soldering paste at an edge point assigned to at least one side of the soldering paste, c) placing an SMD component comprising at least one component contact surface on the printed circuit board contact surface coated with soldering paste in such a way that the at least one component contact surface electrically, thermally and/or mechanically contacts the printed circuit board contact surface via the soldering paste lying therebetween, wherein said placement is carried out in such a way and the position of the at least one adhesive point in step b) is chosen in such a way that the SMD component rests on the soldering paste without contacting the at least one adhesive point, d) waiting for a specifiable duration t, optionally at a specifiable temperature T, until a curing process of the at least one adhesive point is complete, and e) heating, melting and subsequently cooling the soldering paste in order to produce an electrical, thermal and/or mechanical connection between the at least one component contact surface of the SMD component and the at least one printed circuit board contact surface of the circuit carrier, wherein a barrier is formed with the aid of the at least one adhesive point in such a way that, first, the SMD component is allowed to vertically sink in the molten state of the soldering paste and, second, the SMD component is mechanically restricted from horizontally drifting off in the direction of the barrier on the molten soldering paste by means of the barrier.

The inventive method makes it possible to permanently define the position of the SMD component in a horizontal plane and to prevent the component from drifting off, as well as to simultaneously allow the component to sink in relation to the circuit carrier, in order to thereby produce a homogenous soldering point that is largely free of voids. In the present invention, the adhesive points are—in contrast to AT 515071 A1—not used for absolutely fixing the SMD component, but rather for restricting the position or the movability of the component within a horizontal plane. In addition, the invention makes use of the realization that the presence of vias, which cannot be coated with soldering material (particularly the presence of a vias arranged asymmetrically in relation to the contact surface to be soldered), substantially promotes the disadvantageous drift-off of SMD components during the soldering process or significantly increases the extent of the drift-off, respectively. In a few situations, a slight drift-in is in fact tolerable, but a drift-off to a greater extent is problematic. In this document, the terms "drifting in" and "drifting off" are interpreted as follows: the term "drifting in" is interpreted as a movement of the component on the liquid solder within an uncritical range, i.e. to such an extent that the functionality of the soldered connection is not 5 impaired and the deviation from the nominal position is sufficiently small for preventing a (pseudo) fault from being triggered during a subsequent AOI (automated optical inspection). The term "drifting off" is interpreted as a drifting movement to a problematic extent such that, for example, the soldered connection is potentially impaired and/or the deviation from the nominal position is so large that (pseudo) faults are detected during a possible AOI. Since the placement of adhesive points as a restriction is associated with a technical and economical effort, the adhesive points should only be used in instances in which their use is economically justified. This is the reason why the adhesive points are purposefully used for a component that is subject to such vias. The vias particularly may be vias of the type 5, which are formed by a copper sleeve that is embedded in the printed circuit board and filled, e.g., with resin. The thermal conduction essentially takes place via the copper sleeve in this case. Due to the filling, no solder can penetrate into the via and the via cannot be coated, which is why forces that promote a drift-off can act upon the component during the soldering process. This particularly applies to an asymmetric arrangement of the vias in relation to the component to be soldered.

The term "horizontal" refers to an orientation extending parallel to a plane formed by the printed circuit board contact surface. A step f) that comprises the cooling process and the removal of the populated circuit carrier may be carried out after step e). The term "SMD component" refers to any component that is fastened on the surface of the circuit carrier—i.e. does not utilize any "through hole" technology. For example, the SMD components may also be electrically connected to the printed circuit board by means of top-contact bonding.

At least one adhesive point basically is provided for the formation of the barrier. For example, this adhesive point may suffice in situations in which the components rotate or drift in only one direction. One adhesive point that acts opposite to the rotating or drifting direction of the component suffices in this case. The remaining positioning can optionally be ensured with component pins. It is naturally also possible to provide two or more adhesive points. The number of adhesive points can be freely chosen. All characteristics mentioned in the present invention with respect to the "at least one adhesive point" therefore can—if not indicated otherwise—also be applied to two or more adhesive points.

The vias may be realized, e.g., in the form of type 5 vias or type V vias. These are very frequently explicitly arranged in the region of the printed circuit board pad in order to minimize the thermal resistance. The presence of vias that are arranged asymmetrically in relation to the printed circuit board contact surface particularly promotes a drift-off, which is why the arrangement of barriers has proven particularly advantageous in the presence of such asymmetrically arranged vias.

The printed circuit board contact surface, which is coated with soldering paste in step a), particularly may be surrounded by a solder resist layer, wherein the at least one adhesive point is arranged on the solder resist layer and/or on a section of the printed circuit board contact surface that is not coated with soldering paste. The adhesive may be designed for adhering particularly well on the solder resist layer. In addition, the adhesive is thereby prevented from coming in contact with soldering material. Alternatively, the adhesive point can—as mentioned above—also be arranged on the pad (i.e. the printed circuit board contact surface) in itself or on the pad and/or the solder resist layer of the printed circuit board at once. In this context, even an overlap with the soldering paste on the pad can—although not desirable—be tolerated under certain circumstances.

Furthermore, the height of the at least one adhesive point may amount to at least 40%, preferably at least 60%, particularly at least 100%, of the height of a soldering paste deposit formed by the soldering paste in the non-molten state, wherein the barrier is exclusively formed by the at least one adhesive point itself. In this way, a restriction can already be formed by the adhesive points themselves without requiring additional components for this purpose. However, the height of the adhesive points is advantageously chosen in such a way that the component to be secured impacts on the adhesive point in the case of a drift-off. The fact that the solder loses approximately 50% of its volume due to the soldering process can be taken account in this case. For chip components such as ohmic resistances, the paste can be printed, for example, with a height of 120 μm.

At least one adhesive point particularly may be realized in the form of a spherical calotte. This shape may be defined by the surface tension of the adhesive used on the one hand and by the respectively applied method on the other hand. For example, so-called "jet-dispensers" may be used for this purpose. Such a "jet-dispenser" dispenses adhesive points that usually have a shape similar to a spherical calotte due to the deformation of the jetted adhesive "particle" during the impact on the printed circuit board. The utilization of this method also makes it possible to produce another geometry such as so-called adhesive beads by means of these individual points. However, there also exist so-called volumetric dispensers that dispense the adhesive continuously. These dispensers can be used for producing lines or similar geometric shapes of adhesive.

Furthermore, at least a first adhesive point may be expanded linearly so as to form a linear barrier. This includes adhesive beads, as well as adhesive lines.

At least one second adhesive point, which preferably contacts the first adhesive point, particularly may be provided, wherein the second adhesive point is designed linearly such that an essentially L-shaped or U-shaped contour, which at least partially encloses the SMD component, is formed together with the first adhesive point. In this way, the component to be fastened can be largely prevented from drifting off in another direction.

Furthermore, the height of the at least one adhesive point may amount to at least 50 micrometer, preferably at least 100 micrometer.

At least one delimiting body particularly may be placed on the at least one adhesive point after step b) and prior to step d), wherein the barrier is formed with the aid of the delimiting body. The use of delimiting bodies makes it possible to position the barrier closer to the SMD component to be fastened. The geometric shape of the delimiting body can also be purposefully adapted to the shape of the SMD component. For example, the delimiting body may be realized in a U-shaped or L-shaped manner or also have a straight shape. In this context, shapes of polymers or plastic or also of ceramics and metals may be used. The use of a shape consisting of polymers or ceramics has economical advantages. The melting temperature of the delimiting body material used should lie above the maximum temperature of the soldering process and the surface has to be designed in such a way that the adhesive remains attached.

Furthermore, the at least one adhesive point may consist of hot-curing material and curing of the at least one adhesive point in accordance with step d) may take place by increasing the temperature of the circuit carrier together with the at least one adhesive point, wherein this takes place, for example, in the course of a reflow soldering process, and wherein the temperature required for the hot-curing process lies below the melting temperature of the soldering material.

The adhesive material particularly may be chosen in such a way that the volume of the adhesive decreases by no more than 10% during the curing process.

Furthermore, the adhesive material may be realized in a hot-curing manner and chosen in such a way that it expands under the addition of heat during the curing process according to step d). An advantage of an expanding material can be seen in that, in contrast to a spherical calotte, the height does not continuously increase with a shallow incline, but rather has the shape of a steeper restriction that makes it more difficult for a component to drift thereon. Adhesives other than liquid adhesives can also be used. For example, a pasty dispensable adhesive material with the following properties may be used: heat resistance, volume increase under the addition of heat, adhesion on the solder resist and extensive curing prior to reaching the melting temperature of the solder. In this context, it would also be possible, for example, to use a foam on the basis of polyurethane or silicone. The idea behind this is that the dispensed point of such a material expands during the heating process and therefore forms a barrier, which also widens laterally and upward, such that it is much more difficult for the component to overcome this shape of the barrier than an adhesive point that usually has a largely continuous incline up to its maximum height.

The at least one adhesive point particularly may be applied by means of a dispenser and the SMD component may be placed by means of an automatic placement machine, wherein the at least one adhesive point is in step b) positioned in such a way that it has at least a safety clearance from the edge region of the nominal position of the SMD component, and wherein this safety clearance is formed of the sum of the positioning tolerances of the dispenser and the automatic placement machine, the size tolerance of the at least one adhesive point, as well 5 as the component tolerance of the SMD component, and amounts, for example, to at least 50 micrometer. The safety clearance of the adhesive point from an SMD component currently amounts to at least 50 micrometer and, for example, no more than 300 micrometer. As mentioned above, component tolerances should also be taken into account, i.e. not every component has the same size. For example, the component size may differ from the manufacturer specifications by +/−0.1 mm.

Furthermore, the SMD component may have a rectangular footprint and the at least one adhesive point may be positioned in such a way that the at least one adhesive point lies after the placement of the SMD component in step b) in the immediate vicinity of one side of the rectangular footprint while maintaining the safety clearance. In this context, the expression "in the immediate vicinity of one side" means that only the minimum clearance, e.g. 50 micrometer, is provided. The clearance could also be chosen in relation to a corner of the rectangular footprint. The number of adhesive points can be chosen in such a way that just one adhesive point is assigned to each side and/or corner of the SMD component. A drift-off of the component therefore is restricted in all directions. The term "rectangular footprint" does not necessarily have to be interpreted as an exactly rectangular shape—corners naturally may be flattened or rounded or component pins may extend beyond this footprint (this applies, for example, to an LFPAK/SOT699 model).

The invention additionally relates to a circuit carrier manufactured in accordance with the inventive method. Furthermore, the invention may also relate to a motor vehicle headlamp comprising an inventive circuit carrier.

In other words, the invention can also be described as follows:

Certain SMT models such as Powerflat 5×6 or LFPAK/SOT669, but also TO-277A, have on one side individual small component pins (or connection pins; e.g. N-channel MOSFET: gate and source) whereas the majority of the package underside consists of a large, mostly continuous thermal pad (e.g. N-channel MOSFET: drain). The components typically are very precisely placed on the soldering paste deposits (<50 μm accuracy), but factors such as suboptimal footprint dimensions, via technology or finish can cause these components to drift off with the thermal pad during the reflow process, i.e., the overlap between component pads and printed circuit board pads is no longer ideal. This frequently leads to the detection of faults (which in this context are referred to pseudo faults; the component is (mostly) functional, but the deviation of the position is greater than permitted for the AOI) during the automatic optical printed circuit board inspection (AOI) because the position of the component deviates by more than the permitted tolerance, but may in the worst-case scenario also lead to poorly formed soldering points. A simple solution, which basically has been the industry standard for quite some time, would be bonding with SMT adhesive, e.g. at 2 or 4 points along the housing edge, such that the component does not drift off during the reflow process. Direct bonding of the component works as follows: the paste deposits are printed and the adhesive points are then applied adjacent to the paste deposits in such a way that, for example, the edges of the component come to lie in the adhesive during the subsequent placement of the component.

When the populated assembly is subsequently introduced into the reflow furnace, the adhesive cures first of all, usually long before the soldering paste melts. In this way, the component is held in its very precise placement position and can no longer drift off on the liquid solder. However, the disadvantage of this known method is the required quantity of solder for the soldering gap being formed: when a small component is placed onto the paste (with a usual force of 2-6 N), it is slightly pressed into the paste deposit and lies, for example, at a height of 50-100 μm; with larger components, the paste accordingly is compressed to a lesser degree and the component lies at a height in the range of the stencil thickness (100 μm-150 μm). The soldering paste melts during the reflow process and loses approximately 50% of its volume because only the tin content remains in the soldering point. Without adhesive fixing, the component—as already mentioned above—sinks downward from the initial height and a much lower soldering gap is formed. At the same paste quantity, adhesive fixing of the component would have to cause a reduction of the soldered connection—e.g. in a lateral direction. Until now, this was compensated in that more paste is printed laterally adjacent to the pad and the molten solder flows underneath the component via inlet gates during the reflow process (see, for example, EP 323 3345 A1). Consequently, a relatively large amount of lateral overprinting was required for models with relatively large printed circuit board contact surfaces coated with soldering paste and therefore also with soldering paste segmenting (required for flux outgassing during the soldering process). All these precautions already had to be taken during the printed circuit board design and could no longer be carried out in the subsequent course of the product lifecycle without an elaborate change process or revalidation (e.g. due to a change of the soldering gap height).

The invention represents a shift away from the adhesive fixing of the SMD components and makes it possible to produce barriers on the printed circuit board, which prevent certain components placed therein or adjacent thereto from drifting off during the soldering process. Furthermore, the components should not come in contact with the adhesive during its application and therefore also form a soldering gap as if they were not bonded. In contrast to the prior art, components are not prevented from drifting off during the soldering process by means of direct bonding, but rather in that positionally and dimensionally stable adhesive points or elements placed thereon, which are located right next to the component, act as drift-off barrier during the reflow process.

The following sequence may take place during the SMT manufacturing process:

paste printing is initially carried out and SMT adhesive points are subsequently placed right next to the fictitious component edge the component is then placed with the automatic placement machine without contacting the adhesive two options are then available depending on the implementation variation A: adhesive points themselves subsequently form the barrier; the placement process would thereby be completed variation B: an extra barrier element is in this step placed on the adhesive point adjacent to the component adhesive points quickly cure in the reflow furnace and remain in their position, with the solder underneath the component only then beginning to melt.

the component begins to drift in on the liquid solder, but a drift-off is (largely) prevented by the already cured adhesive point (variation A) or the barrier element fixed by means of the adhesive (variation B).

The resulting offset of the component is much smaller than without a barrier.

Unrestricted components could drift off by several 100 μm (and therefore would lie outside the permissible AOI tolerances) whereas the proposed method makes it possible to reduce the drift-off to a justifiable degree (e.g. 100-200 μm).

The invention is described in greater detail below with reference to an exemplary and nonrestrictive embodiment that is illustrated in the figures. In these figures, FIGS. 4a to 4d show different variations of delimiting body configurations according to the invention.

In the following figures, identical characteristics are—if not indicated otherwise—identified by the same reference symbols.

Figure 1A:
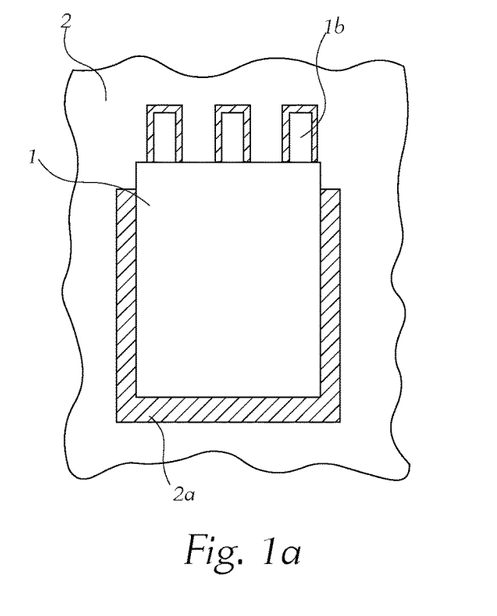
FIG. 1a shows a schematic representation of a section of a circuit carrier with an SMD component to be fastened thereon in accordance with the prior art.
Figure 1B:
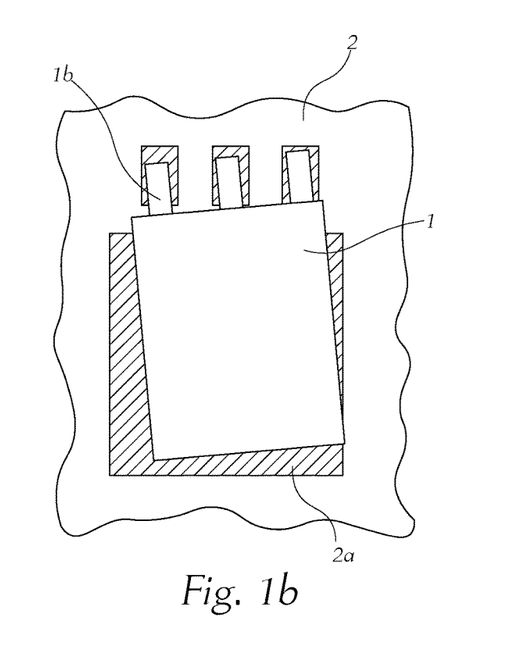
FIG. 1b shows a drifted-off fastened SMD component according to FIG. 1a, FIG. 2a shows a sectional representation of an embodiment according to the invention in the non-soldered state.

FIG. 1a shows a schematic representation of a section of a circuit carrier 2 with an SMD component 1 to be fastened thereon in accordance with the prior art. According to FIG. 1b, the component 1 has drifted off on a not-shown solder deposit 3 during the soldering process and was permanently soldered in this drifted-off end position.

Figure 2A:
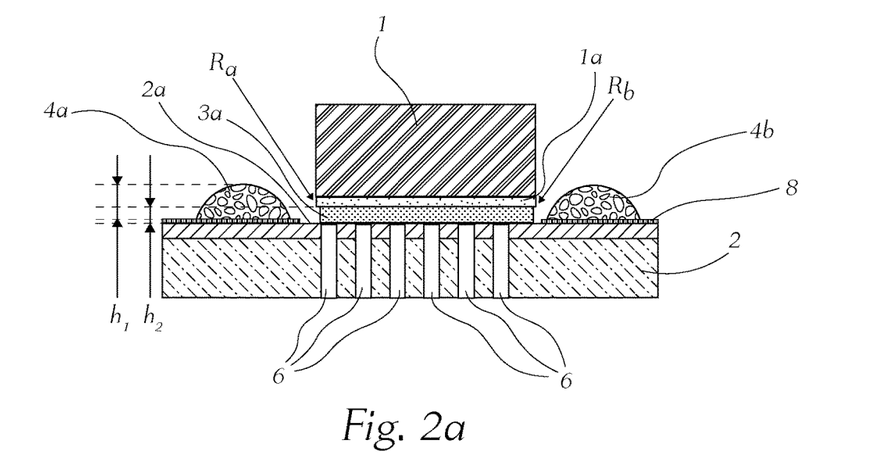
Figures 2B, 2C, 2D:
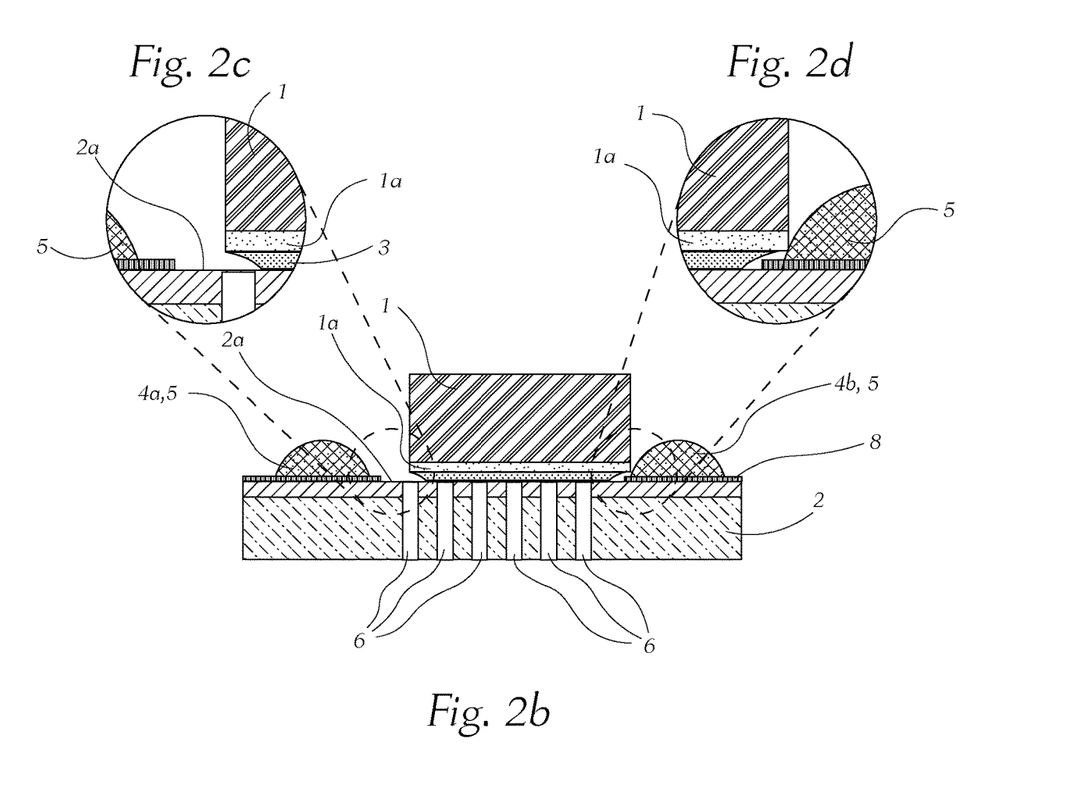
FIG. 2b shows a sectional representation according to FIG. 2a in the soldered state.
FIG. 2c shows a detail of FIG. 2b.
FIG. 2d shows another detail of FIG. 2b, in which the SMD component impacts on a barrier and is thereby held in its position.

FIG. 2a shows a sectional representation of an embodiment according to the invention in the non-soldered state. This figure shows an arrangement on which the inventive method is carried out. The invention relates to a method for soldering an SMD component 1 to a circuit carrier 2 in a positionally stable manner and comprises the following steps a) to e) in the exemplary embodiment shown:

a) Providing a circuit carrier 2 comprising at least one printed circuit board contact surface 2a that is coated with soldering paste 3 and designed for electrically, thermally and/or mechanically contacting the SMD component 1 to be connected. A number of filled vias 6, which cannot be coated with molten soldering material, extend through the circuit carrier 2 at least in the region of the printed circuit board contact surface 2a. This number is basically variable and not limited to a certain value.

b) Applying—in this exemplary embodiment—two adhesive points 4a and 4b onto the circuit carrier 2 in such a way that these adhesive points 4a and 4b delimit the printed circuit board contact surface 2a coated with soldering paste 3 at respective edge points $R_a$ and $R_b$, each of which is assigned to one side of the soldering paste 3. In this context, the term edge point refers to a point that is respectively assigned to one side of the soldering paste 3 or an overlying side of the SMD component 1. The term "delimiting" refers to a "restriction." This does not mean that the edge point is contacted by the respective adhesive point 4a or 4b during the application. On the contrary—a minimum clearance in relation to the SMD component 1 is provided as described in greater detail below. The term "delimiting" refers to the restriction of a drift-off process of the SMD component 1 and the edge points, particularly Ra and Rb, respectively describe a point on exposed edges or projections of the component 1 that impacts on a barrier 5 or an adhesive point 4a or 4b, for example, during a drift-off process.

c) Placing an SMD component 1 comprising at least one component contact surface 1a on the printed circuit board contact surface 2a coated with soldering paste 3 in such a way that the at least one component contact surface 1a electrically, thermally and/or mechanically contacts the printed circuit board contact surface 2a via the soldering paste 3 lying therebetween. The placement is carried out in such a way and the position of the adhesive points 4a and 4b in step b) is chosen in such a way that the SMD component 1 rests on the soldering paste 3 without contacting the adhesive points 4a and 4b.

d) Waiting for a specifiable duration t, e.g. one minute, until a curing process of the adhesive points 4a and 4b is complete (more precisely, this process may take, for example, as long as 1-5 min depending on the temperature—in a typical reflow process with a ~150° C. plateau phase at the beginning, this process will take approximately 90-120 s).

e) Heating, melting and subsequently cooling the soldering paste 3 in order to produce an electrical, thermal and/or mechanical connection between the at least one component contact surface 1a of the SMD component 1 and the at least one printed circuit board contact surface 2a of the circuit carrier 2. A barrier 5 is formed with the aid of the adhesive points 4a and 4b, which in FIG. 2b are illustrated in the already cured state, in such a way that, first, the SMD component is allowed to vertically sink in the molten state of the soldering paste 3 and, second, the SMD component is mechanically restricted from horizontally drifting off in the direction of the barrier 5 on the molten soldering paste 3 by means of the barrier 5. In the present example, the barrier 5 is jointly formed by the two adhesive points 4a and 4b.

FIG. 2c shows a detail of FIG. 2b. According to this figure, the now solidified soldering 5 material 3 has changed with respect to its distribution due to the influence of the via 6: since the via likewise lies in the edge region of the contacting of the SMD component 1 and the via cannot be coated with soldering material 3, the soldering material 3 has withdrawn to a region lying underneath the SMD component 1. Mechanical forces, which promote a drift-off of the component 1, are exerted upon the SMD component 1 due to does "withdrawal." The drift-off does not always occur— although the component 1 did not remain in its position in the present example. In contrast, FIG. 2d shows a scenario, in which the component 1 impacts on the barrier 5 and is held in its position by this barrier.

FIGS. 2a and 2b show that the printed circuit board contact surface 2a, which is coated with soldering paste 3 in step a), is surrounded by a solder resist layer 8, wherein the two adhesive points 4a and 4b are arranged on the solder resist layer 8. However, the adhesive points do not necessarily have to be placed on the printed circuit board layer, but rather may also be located, for example, on the printed circuit board contact surface 2a of the printed circuit board.

The height $h_1$ (see FIG. 2a) of the adhesive points 4a, 4b, 4c, 4d, 4e amounts to at least 40%, preferably at least 60%, particularly at least 100%, of the height $h_2$ (see FIG. 2a) of a soldering paste deposit 3a formed by the soldering paste 3 in the non-molten state, wherein the barrier 5 is exclusively formed by the adhesive points 4a and 4b themselves.

FIGS. 2a and 2b show that the adhesive points 4a and 4b are realized in the form of spherical calottes.

Figure 3A:
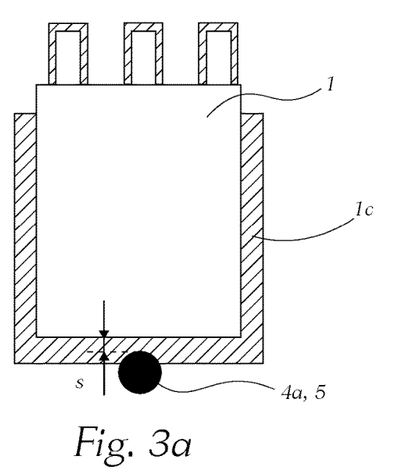
FIGS. 3a to 3d show different variations of adhesive point configurations according to the invention.
Figure 3B:
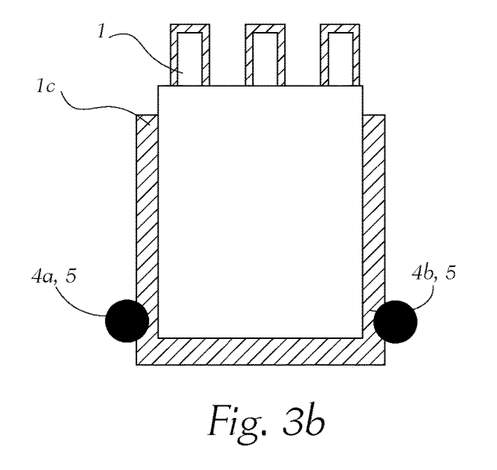
Figure 3C:
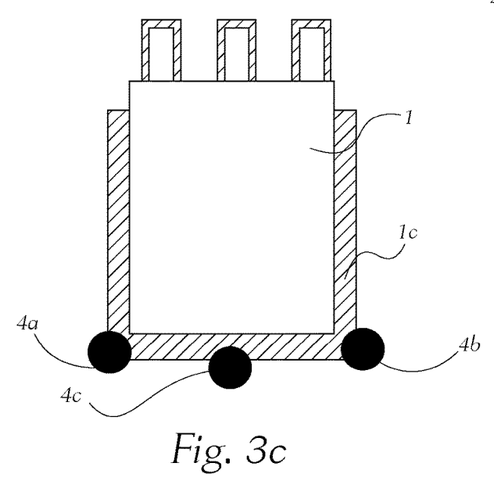
Figure 3D:
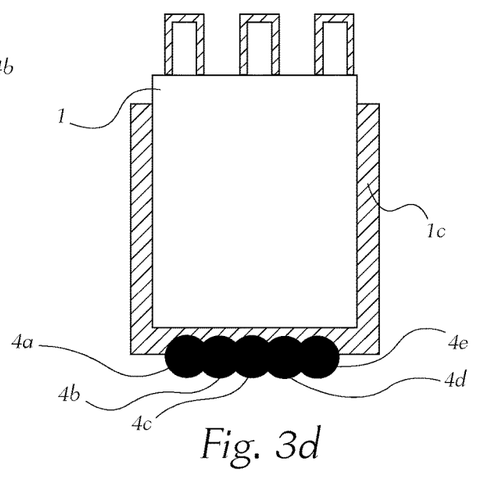

FIGS. 3a to 3d show different variations of adhesive point configurations according to the invention. FIG. 3a shows the use of a single adhesive point 4a that is positioned on one side of the SMD component 1. FIG. 3b shows a variation, in which adhesive points 4a and 4b are respectively positioned on a corner of the SMD component 1. FIG. 3c shows a variation, in which another adhesive point 4c arranged on the side is provided in addition to the corner adhesive points 4a and 4b. FIG. 3d shows the use of five successively arranged adhesive points 4a, 4b, 4c, 4d, 4e, which are jointly expanded linearly in order to form a linear barrier 5 ("adhesive bead"). Numerous other configurations are basically also conceivable. It would be possible, for example, to provide at least one second adhesive point that preferably contacts 5 the first adhesive point, wherein the second adhesive point is designed linearly such that an essentially L-shaped or U-shaped contour, which at least partially encloses the SMD component 1, is formed together with the first adhesive point.

Figure 4A:
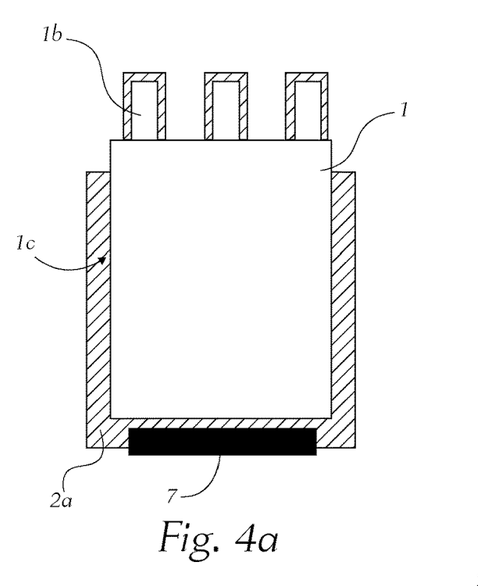
Figure 4B:
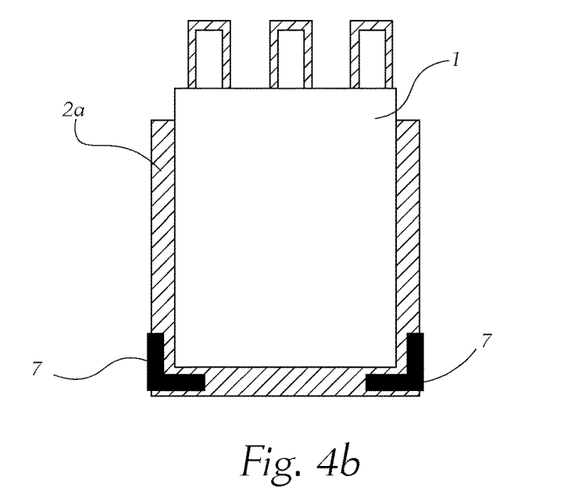
Figure 4C:
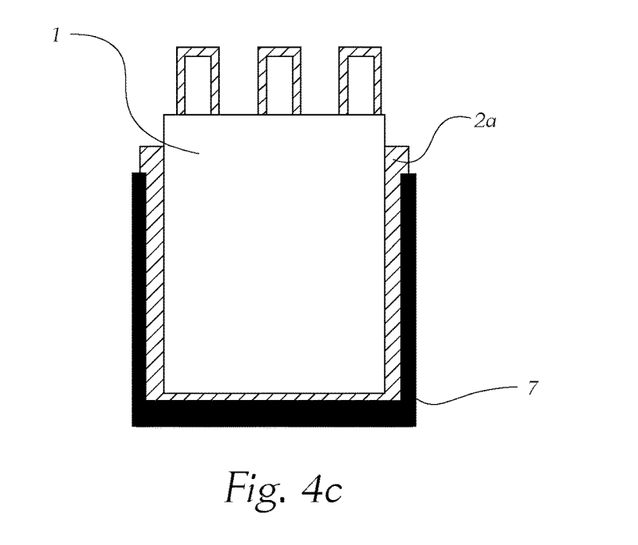

FIGS. 4a to 4c show different variations of delimiting body configurations according to the invention. According to these figures, at least one delimiting body 7 is placed on the at least one adhesive point 4a (which is not illustrated in the figures) after step b) and prior to step d). The barrier 5 is formed with the aid of the delimiting body 7. The delimiting body may be realized in a U-shaped (FIG. 4c) or L-shaped (FIG. 4b) manner or also have a straight shape (FIG. 4a). Multiple delimiting bodies 7 may also be used.

The adhesive points preferably consist of hot-curing material. The hot-curing temperature lies below the melting temperature of the soldering material.

FIGS. 3a to 4c show that the SMD component 1 respectively has a rectangular footprint 1c (see FIGS. 3a and 4a for reference symbols). According to FIG. 3a, the adhesive point 4a is positioned in such a way that it lies after the placement of the SMD component 1 in step b) in the immediate vicinity of one side of the rectangular footprint 1c while maintaining the safety clearance.

The invention is not limited to the embodiments shown, but rather defined by the entire scope of protection of the claims. Individual aspects of the invention or the embodiments can also be selected and combined with one another. Any reference symbols in the claims are exemplary and merely serve for the easier readability of the claims without restricting these claims.

The invention claimed is:

1. A method for soldering an SMD component (1) to a circuit carrier (2) in a positionally stable manner, comprising the following steps:
   a) providing a circuit carrier (2) comprising at least one printed circuit board contact surface (2a) that is coated with soldering paste (3) and designed for electrically, thermally and/or mechanically contacting the SMD component (1) to be connected, wherein a number of filled vias (6), which cannot be coated with molten soldering material, extend through the circuit carrier (2) at least in the region of the printed circuit board contact surface (2a);
   b) applying at least one adhesive point (4a, 4b, 4c, 4d, 4e) onto the circuit carrier (2) in such a way that this adhesive point (4a, 4b, 4c, 4d, 4e) delimits the printed circuit board contact surface (2a) coated with soldering paste (3) at an edge point ($R_a$, $R_b$) assigned to at least one side of the soldering paste (3);
   c) placing an SMD component (1) comprising at least one component contact surface (1a) on the printed circuit board contact surface (2a) coated with soldering paste (3) in such a way that the at least one component contact surface (1a) electrically, thermally and/or mechanically contacts the printed circuit board contact surface (2a) via the soldering paste (3) lying therebetween, wherein said placement is carried out in such a way and the position of the at least one adhesive point (4a, 4b, 4c, 4d, 4e) in step b) is chosen in such a way that the SMD component (1) rests on the soldering paste (3) without contacting the at least one adhesive point (4a, 4b, 4c, 4d, 4e);
   d) waiting for a specifiable duration t until a curing process of the at least one adhesive point (4a, 4b, 4c, 4d, 4e) is complete; and
   e) heating, melting and subsequently cooling the soldering paste (3) in order to produce an electrical, thermal and/or mechanical connection between the at least one component contact surface (1a) of the SMD component (1) and the at least one printed circuit board contact surface (2a) of the circuit carrier (2), wherein a barrier (5) is formed with the aid of the at least one adhesive point (4a, 4b, 4c, 4d, 4e) in such a way that, first, the SMD component is allowed to vertically sink in the molten state of the soldering paste (3) and, second, the SMD component is mechanically restricted from horizontally drifting off in the direction of the barrier (5) on the molten soldering paste (3) by means of the barrier (5),
   wherein the at least one adhesive point (4a, 4b, 4c, 4d, 4e) is applied by means of a dispenser and the SMD component (1) is placed by means of an automatic placement machine, wherein the at least one adhesive point (4a, 4b, 4c, 4d, 4e) is in step b) positioned in such a way that it has at least a safety clearance(s) from the edge region of the nominal position of the SMD component (1), and wherein this safety clearance(s) is formed of the sum of the positioning tolerances of the dispenser and the automatic placement machine, the size tolerance of the at least one adhesive point (4a, 4b, 4c, 4d, 4e), as well as the component tolerance of the SMD component (1), and amounts to at least 50 micrometer.

2. The method according to claim 1, wherein the printed circuit board contact surface (2a), which is coated with soldering paste (3) in step a), is surrounded by a solder resist layer (8), and wherein the at least one adhesive point (4a, 4b, 4c, 4d, 4e) is arranged on the solder resist layer (8) and/or on a section of the printed circuit board contact surface (2a) that is not coated with soldering paste (3).

3. The method according to claim 1, wherein the height ($h_1$) of the at least one adhesive point (4a, 4b, 4c, 4d, 4e) amounts to at least 40% of the height ($h_2$) of a soldering paste deposit (3a) formed by the soldering paste (3) in the non-molten state, and wherein the barrier is exclusively formed by the at least one adhesive point (4a, 4b, 4c, 4d, 4e) itself.

4. The method according to claim 1, wherein at least one adhesive point (4a, 4b, 4c, 4d, 4e) has a spherical segment shape.

5. The method according to claim 1, wherein at least a first adhesive point (4a, 4b, 4c, 4d, 4e) is expanded linearly so as to form a linear barrier (5).

6. The method according to claim 5, wherein an at least one second adhesive point is provided, and wherein the at least one second adhesive point is designed linearly such that an essentially L-shaped or U-shaped contour, which at least partially encloses the SMD component (1), is formed together with the first adhesive point.

7. The method according to claim 1, wherein the height ($h_1$) of the at least one adhesive point (4a, 4b, 4c, 4d, 4e) amounts to at least 50 micrometer.

8. A method for soldering an SMD component (1) to a circuit carrier (2) in a positionally stable manner, comprising the following steps:
  a) providing a circuit carrier (2) comprising at least one printed circuit board contact surface (2a) that is coated with soldering paste (3) and designed for electrically, thermally and/or mechanically contacting the SMD component (1) to be connected, wherein a number of filled vias (6), which cannot be coated with molten soldering material, extend through the circuit carrier (2) at least in the region of the printed circuit board contact surface (2a);
  b) applying at least one adhesive point (4a, 4b, 4c, 4d, 4e) onto the circuit carrier (2) in such a way that this adhesive point (4a, 4b, 4c, 4d, 4e) delimits the printed circuit board contact surface (2a) coated with soldering paste (3) at an edge point ($R_a$, $R_b$) assigned to at least one side of the soldering paste (3);
  c) placing an SMD component (1) comprising at least one component contact surface (1a) on the printed circuit board contact surface (2a) coated with soldering paste (3) in such a way that the at least one component contact surface (1a) electrically, thermally and/or mechanically contacts the printed circuit board contact surface (2a) via the soldering paste (3) lying therebetween, wherein said placement is carried out in such a way and the position of the at least one adhesive point (4a, 4b, 4c, 4d, 4e) in step b) is chosen in such a way that the SMD component (1) rests on the soldering paste (3) without contacting the at least one adhesive point (4a, 4b, 4c, 4d, 4e);
  d) waiting for a specifiable duration t until a curing process of the at least one adhesive point (4a, 4b, 4c, 4d, 4e) is complete; and
  e) heating, melting and subsequently cooling the soldering paste (3) in order to produce an electrical, thermal and/or mechanical connection between the at least one component contact surface (1a) of the SMD component (1) and the at least one printed circuit board contact surface (2a) of the circuit carrier (2), wherein a barrier (5) is formed with the aid of the at least one adhesive point (4a, 4b, 4c, 4d, 4e) in such a way that, first, the SMD component is allowed to vertically sink in the molten state of the soldering paste (3) and, second, the SMD component is mechanically restricted from horizontally drifting off in the direction of the barrier (5) on the molten soldering paste (3) by means of the barrier (5),
  wherein an at least one delimiting body (7) is placed on the at least one adhesive point (4a) after step b) and prior to step d), and wherein the barrier (5) is formed with the aid of the at least one delimiting body (7).

9. The method according to claim 1, wherein the at least one adhesive point (4a, 4b, 4c, 4d, 4e) consists of hot-curing material and curing of the at least one adhesive point (4a, 4b, 4c, 4d, 4e) in accordance with step d) takes place by increasing the temperature of the circuit carrier (2) together with the at least one adhesive point (4a, 4b, 4c, 4d, 4e), wherein this takes place in the course of a reflow soldering process, and wherein the temperature required for the hot-curing process lies below the melting temperature of the soldering material.

10. The method according to claim 1, wherein the adhesive material is chosen in such a way that the volume of the adhesive decreases by no more than 10% during the curing process.

11. The method according to claim 1, wherein the adhesive material is realized in a hot-curing manner and chosen in such a way that it expands under the addition of heat during the curing process according to step d).

12. The method according to claim 1, wherein the SMD component (1) has a rectangular footprint (1c) and the at least one adhesive point (4a, 4b, 4c, 4d, 4e) is positioned in such a way that the at least one adhesive point (4a, 4b, 4c, 4d, 4e) lies after the placement of the SMD component (1) in step b) in the immediate vicinity of one side of the rectangular footprint (1c) while maintaining the safety clearance(s).

13. The method according to claim 1, wherein the number of adhesive points (4a, 4b, 4c, 4d, 4e) is in step b) chosen in such a way that just one adhesive point (4a, 4b, 4c, 4d, 4e) is assigned to each side and/or corner of the SMD component (1).

14. The method according to claim 3, wherein the height ($h_1$) of the at least one adhesive point (4a, 4b, 4c, 4d, 4e) amounts to at least 60% of the height ($h_2$) of the soldering paste deposit (3a).

15. The method according to claim 3, wherein the height ($h_1$) of the at least one adhesive point (4a, 4b, 4c, 4d, 4e) amounts to at least 100% of the height ($h_2$) of the soldering paste deposit (3a).

16. The method according to claim 6, wherein the at least one second adhesive point-contacts the first adhesive point.

17. The method according to claim 7, wherein the height ($h_1$) of the at least one adhesive point (4a, 4b, 4c, 4d, 4e) amounts to at least 100 micrometer.

* * * * *